(12) United States Patent
Nilson et al.

(10) Patent No.: US 6,782,247 B2
(45) Date of Patent: Aug. 24, 2004

(54) CMOS FREQUENCY CONVERSION USING DUAL MIXERS FOR SIDEBAND SUPPRESSION

(75) Inventors: Christopher D. Nilson, San Jose, CA (US); Thomas G. McKay, Felton, CA (US)

(73) Assignee: Zeevo, Inc., Santa Clara, CA (US)

( * ) Notice: Subject to any disclaimer, the term of this patent is extended or adjusted under 35 U.S.C. 154(b) by 632 days.

(21) Appl. No.: 09/825,250

(22) Filed: Apr. 2, 2001

(65) Prior Publication Data

US 2002/0142747 A1 Oct. 3, 2002

(51) Int. Cl.[7] ................................................ H04B 1/26
(52) U.S. Cl. ........................ 455/313; 455/255; 455/323
(58) Field of Search ................................. 455/313, 314, 455/315, 316, 323, 326, 147, 154.1, 205, 209, 255, 257, 259, 203, 204; 332/170; 329/318, 356, 375; 340/825.69, 554; 342/44

(56) References Cited

U.S. PATENT DOCUMENTS 4,286,260 A * 8/1981 Gershberg et al. .......... 340/554
4,417,157 A * 11/1983 Gershberg et al. .......... 327/502
4,888,591 A * 12/1989 Landt et al. ................... 342/44
5,481,257 A * 1/1996 Brubaker et al. ...... 340/825.69

* cited by examiner

Primary Examiner—Tony T. Nguyen
(74) Attorney, Agent, or Firm—Townsend and Townsend and Crew LLP

(57) ABSTRACT

Disclosed is a frequency conversion circuit with sideband suppression in which a first mixer receives an in-phase signal ($IF_i$) and is driven by a local oscillator having an in-phase (0°) oscillator signal ($LO_i$), and produces two sideband signals (LO+IF, LO−IF). A second mixer receives a quadrature phase frequency signal ($IF_q+$) and is driven by a local oscillator having a quadrature (180°) oscillator signal ($LO_q$), and produces two sideband signals ($LO+IF_q$, $LO-IF_q$). One of the sidebands from the second mixer is 180° out of phase with respect to the same sideband from the first mixer. A signal combiner then receives and combines the two sidebands from the first mixer and the two sidebands from the second mixer, the signal combiner suppressing one sideband and enhancing the other sideband. In preferred embodiments, the mixers comprise MOSFET transistors and the signal combiner comprises capacitive elements.

6 Claims, 3 Drawing Sheets

CMOS FREQUENCY CONVERSION USING DUAL MIXERS FOR SIDEBAND SUPPRESSION

CROSS-REFERENCES TO RELATED APPLICATIONS

The patent application is related to copending application Ser. No. 20408-17.

BACKGROUND OF THE INVENTION

This invention relates generally to frequency conversion of electrical signals, and more particularly the invention relates to sideband suppression in frequency conversion.

Audio signals and other low frequency signals must be up converted to higher frequencies for wireless transmission. Typically, a mixer driven by a high frequency local oscillator (LO) is used to step up the low frequency (IF) signal. A mixer generates two sidebands, $F_{LO}+F_{IF}$ and $F_{LO}-F_{IF}$. Before transmitting the output from the mixer, one of the sidebands must be suppressed, otherwise the two sidebands can interfere and result in garbled information.

Heretofore, sideband suppression has been achieved by use of active circuit components and buffers and filters which consume power. Further, output signals typically are currents and not voltages. Such techniques are not very efficient, especially in CMOS circuit technology.

SUMMARY OF THE INVENTION

In accordance with the invention, a mixer is provided which is compatible with CMOS technology and achieves voltage mode sideband suppression.

Briefly, a mixer in accordance with the invention uses two mixer circuits operating on in-phase and quadrature phase low frequency (IF) sidebands with the two mixers driven by local oscillators having the same frequency but phase offset signals. The outputs of the two mixers are combined to eliminate one of the sidebands as determined by the phase relationships of the IF input signals to the two mixers.

More particularly, by introducing phase shift, a sign reversal is realized in one of the sidebands from one of the mixers. When the outputs of the two mixers are combined, the sign reversal leads to cancellation of one sideband.

The invention and objects and pictures thereof will be more readily apparent from the following detailed description and appended claims when taken with the drawing.

DETAILED DESCRIPTION OF THE SPECIFIC EMBODIMENTS

Figure 1A:
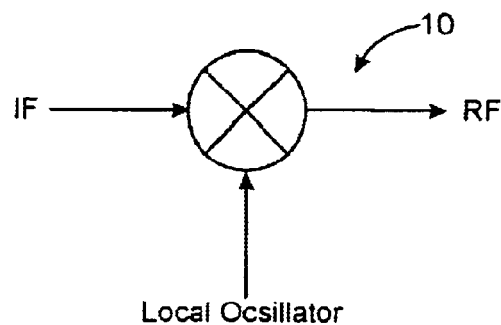
FIG. 1A illustrates a conventional mixer.
Figure 1B:
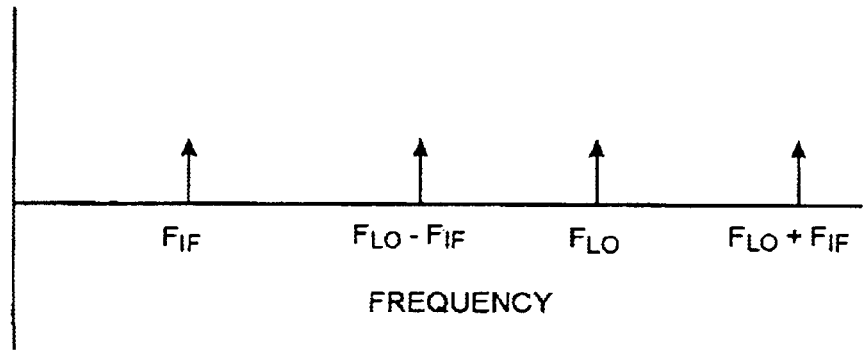
FIG. 1B illustrates input and output signals for the mixer.

Referring now to the drawings, FIG. 1 illustrates a conventional mixer 10 in which an IF input signal (e.g. 100 kHz) is mixed with an output of a local oscillator (e.g. 2.45 GHz) to produce an output RF signal which is stepped up in frequency and includes two sidebands of LO+IF (2.55 GH$_z$) and LO−IF (2.35 GH$_z$), as illustrated in FIG. 1B.

As noted above, the presence of two sideband signals can interfere and result in garbled information in a wireless transmission system. Thus, one of the sidebands is suppressed before transmission.

In accordance with the invention, suppression of one sideband in a voltage mode mixer/converter using CMOS technology is provided with enhanced power efficiency. Heretofore, sideband suppression has been realized in current mode circuitry and through the use of buffers and filters, which increase power consumption.

Figure 2:
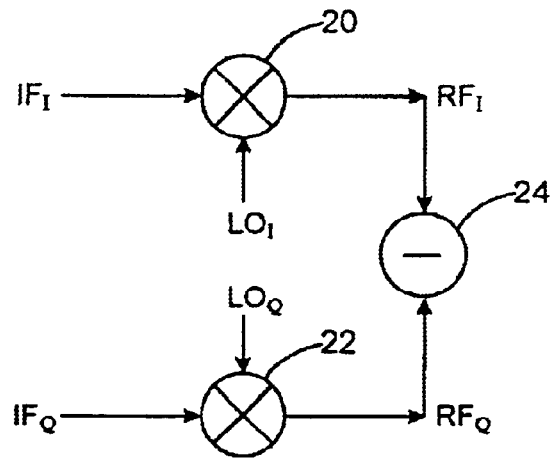
FIG. 2 illustrates a mixer/combiner circuit in accordance with the invention.

FIG. 2 is a schematic of a mixer/combiner circuit in accordance with the invention in which two mixers, 20, 22 receive an in-phase IF signal (IF$_i$) and a quadrature IF signal (IF$_q$) and with mixer 20 driven by an in-phase local oscillator signal (LO$_i$) and mixer 22 is driven by a quadrature local oscillator (LO$_q$) signal. As will be described hereinbelow, the sideband output from mixers 20, 22 are combined at 24 (either by addition or subtraction) and combiner 24 suppresses one of the sidebands from the two mixers. The 90° phase difference between the in-phase and quadrature phase signals causes sign reversals in one of the sidebands so that in combining the mixer outputs, one sideband cancels. The canceled sideband depends on the in-phase and quadrature phases of the local oscillators and the phases of the input signals.

Figure 3A:
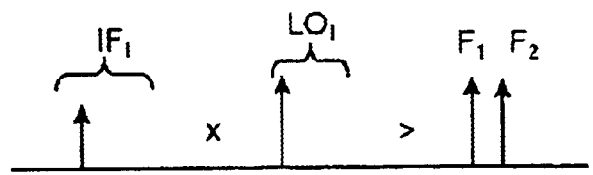
FIG. 3 illustrates input and output signals for the mixer/combiner of FIG. 2.
Figure 3B:
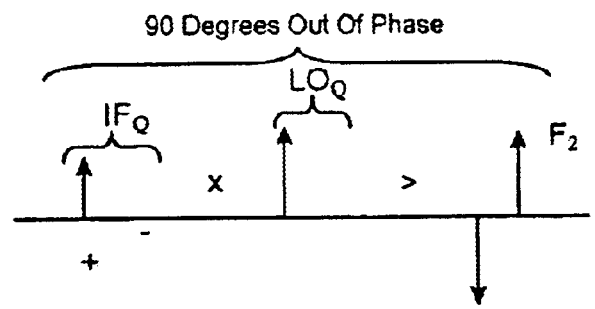
Figure 3C:
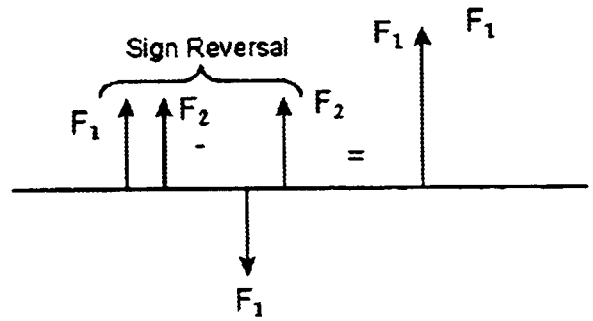

FIGS. 3A–3C illustrate, respectively, the inputs and outputs of mixer 20, the inputs and outputs of mixer 22, and the inputs and outputs of combiner 24. As noted, the IF$_i$ input when mixed with LO$_i$ in mixer 20 produces the two sidebands F1, F2, both of which are in phase. In FIG. 3B the IF$_q$ input when mixed with LO$_q$ in mixer 22 produces two sidebands F1, F2, but sideband F1 is 180° out of phase with respect to sideband F2. In FIG. 3C the two sidebands from FIG. 3A are subtracted from the two sidebands from FIG. 3B, whereby sideband F1 is reinforced, whereas sideband F2 is canceled.

Figure 4:
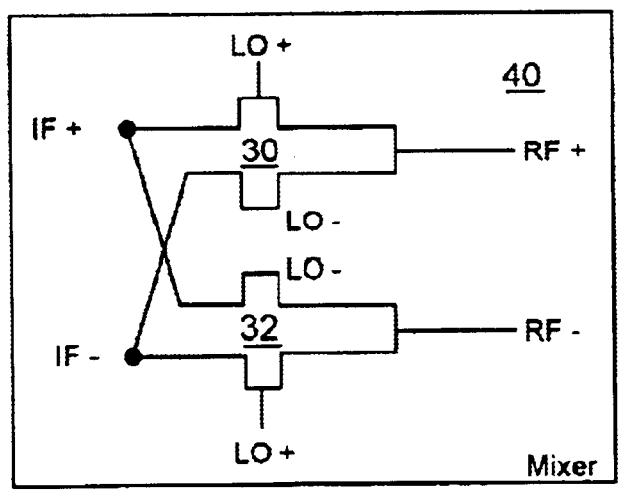
FIG. 4 is a schematic of a CMOS mixer in accordance with an embodiment of the invention.

FIG. 4 is a schematic of a CMOS mixer in accordance with an embodiment of the present invention. In implementing the mixer, two inputs must be provided, the IF$_i$+ input and an IF$_i$− input which is 180° with respect to the IF$_i$+ input. By providing the two signals at 180° phase difference, subtraction of a signal is readily implemented.

The IF$_i$+ signal is applied to two inputs of MOS transistor pairs 30, 32, and IF$_i$− signal is applied to two inputs of the MOS transistor pairs 30, 32. The two transistors in each pair (30, 32) are driven by LO$_i$+ and LO$_i$− local oscillator signals, and the outputs of the transistor pairs are sideband signals RF$_i$+ and RF$_i$−.

Figure 5:
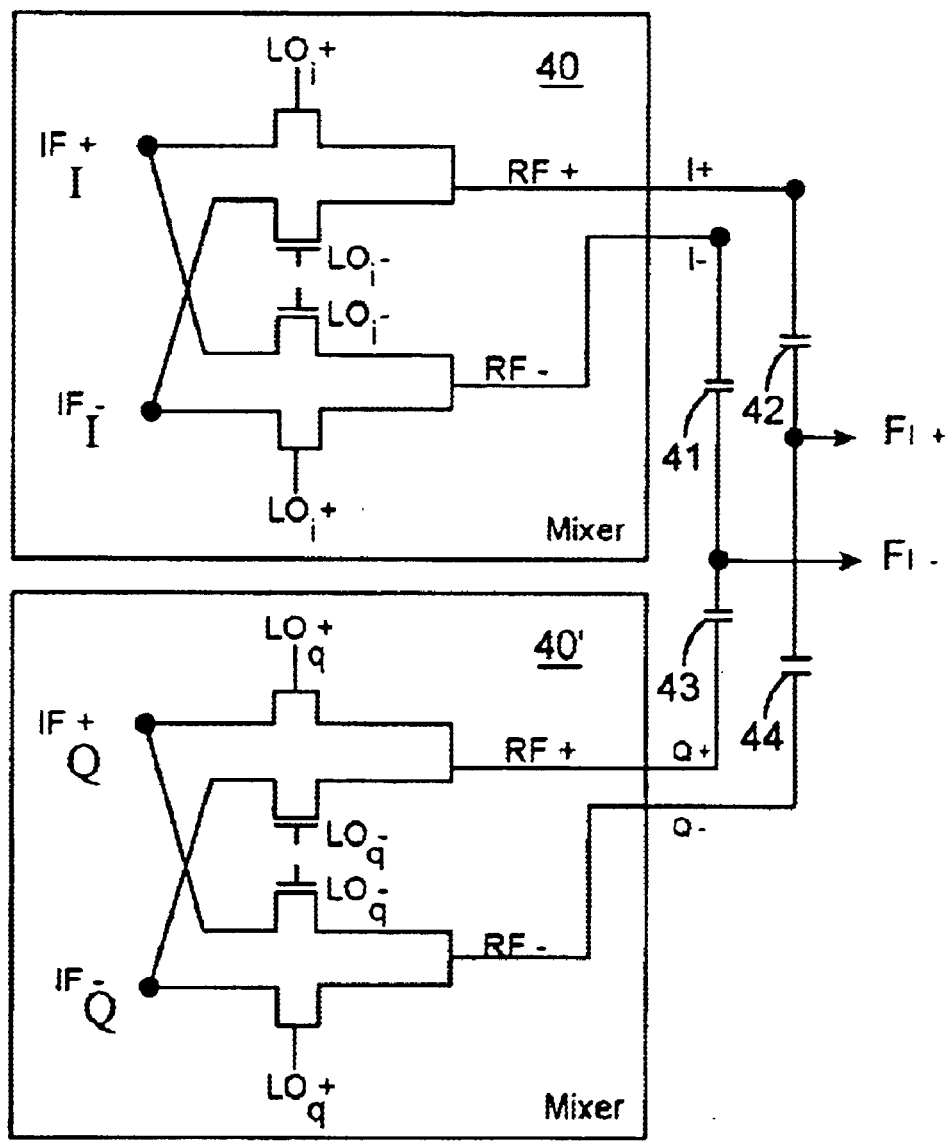
FIG. 5 is a schematic of a CMOS mixer/combiner in accordance with an embodiment of the invention.

In implementing the combiner in accordance with the invention, the in-phase IF mixer 40 of FIG. 4 is used with a similar quadrature IF mixer 40' as shown in FIG. 5. Mixer 40 receives IF$_i$+ and IF$_i$− input signals and is driven by local oscillator, LO$_i$+ and LO$_i$− signals to produce RF$_i$+ and RF$_i$− sidebands. Mixer 40' receives IF$_q$+ and IF$_q$− input signals and is driven by local oscillator (LO+, LO−) signals to produce RF$_i$+ and RF$_i$− output sidebands. The sideband output from mixers 40, 40' are then combined capacitively by capacitors 41–44 with the combined outputs being the + and − sideband (e.g., F1) similar to the representation in FIG. 3C.

The mixer combiner in accordance with the invention achieves sideband suppression in a voltage mode operation with CMOS technology. The circuitry is power efficient and provides linearity in operation. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A frequency conversion circuit with sideband suppression comprising:

(a) a first mixer for receiving an in-phase signal ($IF_i$) and driven by a local oscillator having an in-phase oscillator signal ($LO_i$), and producing sideband signals ($LO+IF_i$, $LO-IF_i$), (b) a second mixer for receiving a quadrature phase frequency signal ($IF_q$) relative to the in-phase signal and driven by a local oscillator having a quadrature oscillator signal ($LO_q$) relative to the in-phase oscillator signal, and producing two sidebands ($LO+IF_q$, $LO-IF_q$), one of the sidebands from the second mixer being 180° out of phase with respect to the same sideband from the first mixer, and (c) a signal combiner for receiving and combining the two sidebands in the first mixer and the two sidebands from the second mixer, the signal combiner suppressing one sideband and enhancing the other sideband.

2. The frequency conversion circuit as defined by claim 1 wherein each mixer comprises a first pair of field effect transistors and a second pair of field effect transistors, each pair of field effect transistors receiving a positive (0°) input signal and a negative (180°) input signal and each transistor of each pair driven by a positive (0°) local oscillator signal or a negative (180°) local oscillator signal and with the outputs of each pair of field effect transistors connected together to provide one of two outputs (RF+, RF−) of the mixer.

3. The frequency conversion circuit as defined by claim 2 wherein the signal combiner comprises capacitive means for combining one output of one mixer with one output of the other mixer, whereby the positive (0°) and negative (180°) signals of one sideband are provided as outputs by the combiner.

4. The frequency conversion circuit as defined by claim 3 wherein the signal combiner comprises first and second serially connected capacitors connecting two mixer outputs, and a third and fourth serially connected capacitors connecting the other two mixer outputs, common terminals of the two serially connected capacitors providing the signal combiner outputs.

5. The frequency conversion circuit as defined by claim 4 wherein each input signal to a mixer is applied to one transistor driven by a positive (0°) local oscillator signal and is applied to another transistor driven by a negative (180°) local oscillator signal.

6. The frequency conversion circuit as defined by claim 2 wherein each input signal to a mixer is applied to one transistor driven by a positive (0°) local oscillator signal and is applied to another transistor driven by a negative (180°) local oscillator signal.

* * * * *